United States Patent
Murakami

(10) Patent No.: US 9,508,753 B2
(45) Date of Patent: Nov. 29, 2016

(54) DISPLAY APPARATUS

(71) Applicant: Mitsubishi Electric Corporation, Tokyo (JP)

(72) Inventor: Katsuaki Murakami, Kumamoto (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 14/992,339

(22) Filed: Jan. 11, 2016

(65) Prior Publication Data

US 2016/0211275 A1   Jul. 21, 2016

(30) Foreign Application Priority Data

Jan. 19, 2015   (JP) ................. 2015-007652

(51) Int. Cl.
*H01L 27/12* (2006.01)
*G02F 1/1362* (2006.01)

(52) U.S. Cl.
CPC ....... *H01L 27/124* (2013.01); *G02F 1/136259* (2013.01)

(58) Field of Classification Search
CPC .................. H01L 27/124; G02F 1/136259
See application file for complete search history.

(56) References Cited

U.S. PATENT DOCUMENTS

| | | | | |
|---|---|---|---|---|
| 6,403,980 B1* | 6/2002 | Park | ............... | G02F 1/136213 257/296 |
| 6,833,882 B2* | 12/2004 | Lee | ............... | G02F 1/136259 349/139 |
| 7,847,914 B2 | 12/2010 | Kim et al. | | |
| 2004/0263724 A1 | 12/2004 | Kim et al. | | |

FOREIGN PATENT DOCUMENTS

| | | |
|---|---|---|
| JP | 05-249488 A | 9/1993 |
| JP | 2002-303881 A | 10/2002 |
| JP | 2005-018080 A | 1/2005 |
| JP | 2009-151094 A | 7/2009 |

* cited by examiner

*Primary Examiner* — David Vu
(74) *Attorney, Agent, or Firm* — Studebaker & Brackett PC

(57) ABSTRACT

Provided is a display apparatus capable of stably repairing a bright spot defect to be a black spot without decreasing an aperture ratio of an array substrate. The display device includes: a substrate having a plurality of semiconductor switching elements disposed thereon; a repair island pattern formed on the substrate; a pixel electrode formed to overlap with the repair island pattern in a plan view and not to come into contact with the repair island pattern; and a common electrode overlapping with the repair island pattern in a plan view and having a connection part for connecting the common electrode to the repair island pattern.

13 Claims, 3 Drawing Sheets

F I G. 7
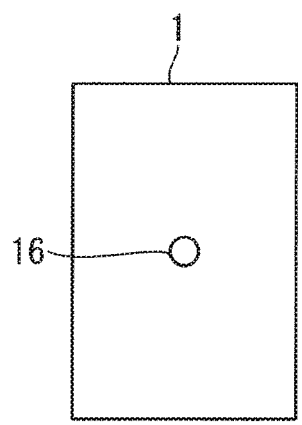
F I G. 8
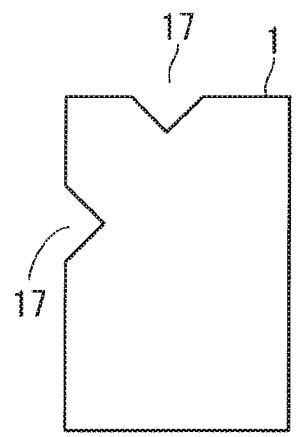

DISPLAY APPARATUS

BACKGROUND OF THE INVENTION

Field of the Invention

The present invention relates to a display apparatus having a plurality of semiconductor switching elements.

Description of the Background Art

In recent years, individual elements to constitute display apparatuses have been smaller or more precise. Further, the market has seen a growing need for an improvement in quality of the display apparatuses. Specifically, the market has seen an increasingly strict need for the improvement in quality where a display apparatus with only one bright spot detect (a pixel that is always bright) is judged to be a defective. Such a need unfortunately reduces productivity of the display apparatuses.

To meet the need for the improvement in quality and enhance the productivity, repairing bright spot defects to be black spot defects (pixels that are always dark) is currently used for an effective way to reduce the bright spot defects.

For instance, reference is made to an array of a twisted nematic (TN) structure. Disclosed is a method of repairing a target pixel to be always a black spot by irradiating, with a laser, a location where a gate wire and a pixel electrode overlap with each other in a plan view and by short-circuiting (fusing) the gate wire and the pixel electrode, thus to always put a gate potential into the pixel electrode (e.g., see Japanese Patent Application Laid-Open No. 05-249488).

Further, reference is made to an array of an in-place-switching structure (hereinafter, referred to as an in-place-switching mode). Disclosed is a method of repairing a target pixel to be a black spot by irradiating, with a laser, a location where a common wire and a pixel electrode overlap with each other in a plan view and by short-circuiting (fusing) the common wire and the pixel electrode, thus to always put a common potential into the pixel electrode (e.g., see Japanese Patent Application Laid-Open No, 2009-151094).

In response to a need for a further improvement in display quality, the use of the in-place-switching mode having excellent view angle characteristics and a fringe-field-switching (FFS) mode capable of improving an effective aperture ratio for lower power consumption has been recently increasing.

A display apparatus that uses the in-place-switching mode and the FFS mode has normally-black display characteristics. Accordingly, it is possible to change the bright spot defect to the black spot by causing the pixel electrode and the common electrode to have the same potential. To achieve such a change to the black spot, one known repair method includes connecting the pixel electrode and the common electrode in a perspective view by irradiating, with a laser, an area where the pixel electrode and the common electrode overlap with each other in a plan view.

However, a transparent electrode of, for example, indium tin oxide (ITO) is often used as the pixel electrode and common electrode in an array structure that uses the in-place-switching mode and the FFS mode. Although ITOs need to be connected to each other for repair, they are hard to be connected with the laser (a stable connection with a low resistance is impossible). This unfortunately degrades the stability of the repair.

To avoid such a connection of the ITOs, one method includes disposing, in advance, metal thin films for repair separately connected to the ITOs used as the pixel electrode and the ITO used as the common electrode, respectively, and then connecting the metal thin films for repair to each other with the laser when a repair is necessary. This method enhances the stability of the repair, but unfortunately decreases an aperture ratio of an array substrate due to the disposal of the metal thin films, which do not contribute to the constitution of the display apparatus, thus resulting in more power consumption.

SUMMARY OF THE INVENTION

The present invention has been made to solve the above problem. It is an object of the present invention to provide a display apparatus capable of stably repairing a bright spot defect to be a black spot without decreasing an aperture ratio of an array substrate.

The display apparatus includes: an array substrate having a plurality of semiconductor switching elements disposed thereon; a metal pattern formed on the array substrate; a pixel electrode formed to overlap with the metal pattern in a plan view and not to come into contact with the metal pattern; and a common electrode overlapping with the metal pattern in a plan view and having a connection part for connecting the common electrode to the metal pattern.

According to the present invention, the display apparatus includes: the array substrate having the plurality of semiconductor switching elements disposed thereon; the metal pattern formed on the array substrate; the pixel electrode formed to overlap with the metal pattern in the plan view and not to come into contact with the metal pattern; and the common electrode overlapping with the metal pattern in the plan view and having the connection part for connecting the common electrode to the metal pattern. This allows for a stable repair of the bright spot defect for changing into the black spot without decreasing the aperture ratio of the array substrate.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 7 and 8 are diagrams illustrating one examples of the shape of a repair island pattern according to a fifth preferred embodiment of the present invention.

DESCRIPTION OF THE PREFERRED EMBODIMENTS

Based on the drawings, the following describes preferred embodiments of the present invention.

First Preferred Embodiment

Figure 1:
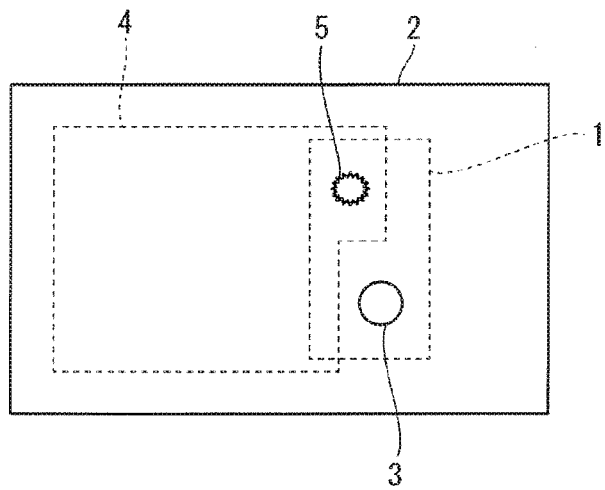
FIG. 1 is a plan view illustrating one example of a configuration of an array substrate in a display apparatus according to a first preferred embodiment of the present invention.

FIG. 1 is a plan view illustrating one example of a configuration of an array substrate in a display apparatus according to a first preferred embodiment of the present invention. In addition, the description is given throughout this preferred embodiment by assuming that the display apparatus is a liquid crystal display apparatus.

The liquid crystal display apparatus is formed of an array substrate, an opposite substrate disposed correspondingly to the array substrate, and a liquid crystal disposed between the array substrate and the opposite substrate. The array substrate has a plurality of gate signal lines and a plurality of source signal lines each arranged in a lattice pattern in row and column directions, and pixels are formed in each area defined by the gate signal lines and the source signal lines. Moreover, semiconductor switching elements, which are here thin film transistors (TFTs), are disposed near intersections of the gate signal lines and source signal lines. A gate electrode of each TFT is connected to each gate signal line; a source electrode of the TFT, to each source signal line; and a drain electrode of the TFT, to a pixel electrode. The drain electrode of the TFT is connected to a common wire via a holding capacity. The common wire here means a wire elongating from a common electrode.

As illustrated in FIG. 1, a pixel electrode 4 is formed to overlap with a repair island pattern 1 (a metal pattern) in a plan view and not to come into contact with the repair island pattern 1. A common electrode 2 overlaps with the repair island pattern 1 in a plan view and has a contact hole 3 (a connection part) for connecting the common electrode 2 to the repair island pattern 1. Note that the common electrode 2, the pixel electrode 41, and the repair island pattern 1 are formed in this order from the front toward the back of the sheet of FIG. 1, the details of which will be described later in FIG. 3. The pixel electrode 4 is an electrode to constitute individual pixels of the liquid crystal display apparatus.

The repair island pattern 1 and the common electrode 2 are electrically connected via the contact hole 3, and a potential of the common electrode 2 is supplied to the repair island pattern 1. The repair island pattern 1 and the common electrode 2 may be connected by laser irradiation. The common electrode 2, which is often a transparent electrode of, for example, ITO and is hard to be connected by the laser irradiation, is desirably connected to the repair island pattern 1 via the contact hole 3 by previously forming the contact hole 3 as illustrated in FIG. 1.

The repair island pattern 1 and the pixel electrode 4 are formed so that parts of them overlap with each other in a plan view. The repair island pattern 1 and the pixel electrode 4 are connected in a repair connection part 5 in repairing, the details of which will he described later. Note that as illustrated in FIG. 1, the repair connection part 5 may be, but not limited to, an area in which the repair island pattern 1 and the pixel electrode 4 being the transparent electrode overlap with each other. For instance, to further enhance the stability of repair, the repair connection part 5 may be an area in which the repair island pattern 1 and a drain electrode 6 of a metal thin film overlap with each other as illustrated in FIG. 2, where the drain electrode 6 is formed to come into contact with the pixel electrode 4.

Figure 2:
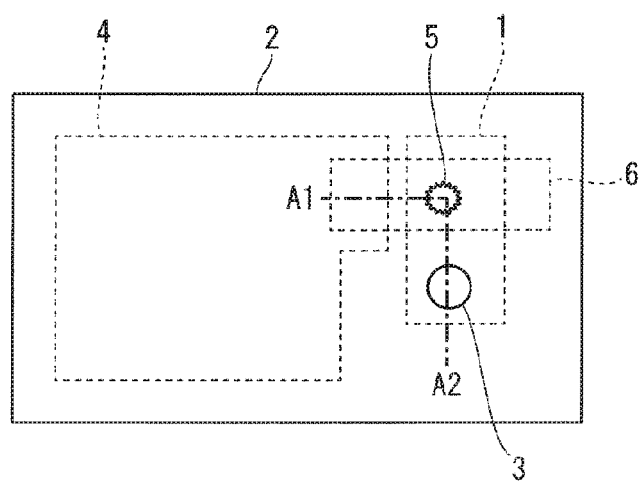
FIG. 2 is a plan view illustrating another example of the configuration of the array substrate in the display apparatus according to the first preferred embodiment of the present invention.
Figure 3:
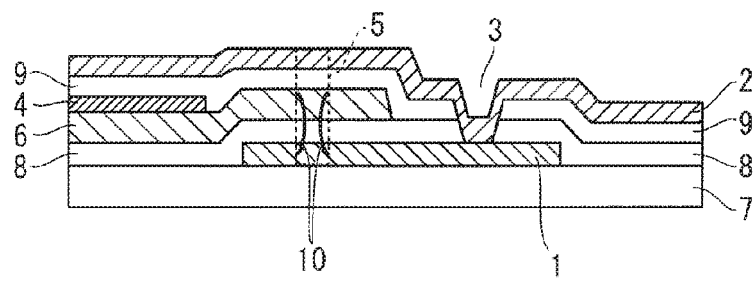
FIG. 3 is a cross-sectional view taken along line A1-A2 in FIG. 2.

FIG. 3 is a cross-sectional view taken along line A1-A2 in FIG. 2.

As illustrated in FIG. 3, the repair island pattern 1 is formed in a predetermined area on a substrate 7, and an insulating film 8 is formed to cover the repair island pattern 1. The drain electrode 6 is formed on the insulating film 8 to come into contact with the pixel electrode 4 and to partially overlap with the repair island pattern 1 in a cross-sectional view. An insulating film 9 is formed to cover the pixel electrode 4, the drain electrode 6, and the insulating film 8. The contact hole 3 is formed in the insulating films 8 and 9 of the repair island pattern 1, and the common electrode 2 is formed to cover the insulting film 9 and the surface of the contact hole 3. Accordingly, the repair island pattern 1 and the common electrode 2 are connected to each other, and the repair island pattern 1 and the drain electrode 6 are not connected to each other.

A predetermined test has been done to the substrate 7 having the configurations illustrated in FIGS. 1 and 2, to find that when a defective pixel being a bright spot defect is found, the laser irradiation in the repair connection part 5 short-circuits the repair island pattern 1 and the pixel electrode 4 (FIG. 1) or short-circuits the repair island pattern 1 and the pixel electrode 6 (FIG. 3). Specifically, one example in FIG. 3 includes that the laser irradiation in the repair connection part 5 fuses a metal of the repair island pattern 1 and a metal of the drain electrode 6. Then, the fused metals are connected to each other, thus connecting the repair island pattern 1 and the drain electrode 6. In other words, repairing causes the repair island pattern 1 and the drain electrode 6 to be connected to each other via a fused metal film 10. Since a common potential is supplied from the common electrode 2 to the repair island pattern 1, the common potential is supplied also to the pixel electrode 4 after repairing. When a display mode of the display apparatus is an in-place-switching mode or an FFS mode, the common electrode 2 and the pixel electrode 4 have the same potential (the common potential), thus forcing a defective pixel being a bright spot defect to be a black spot.

Note that in FIG. 3, it is desirable not to form the common electrode 2 and the pixel electrode 4 in an area (the repair connection part 5) to be irradiated with the laser in order to prevent redundant spreading objects resulted from the laser irradiation.

Although the ITO is used as a material for the transparent electrode in the above description, the material is not limited to the ITO. For example, an oxide material, such as InZnO or InGaZnO may be used as the material for the transparent electrode.

As discussed above, according to the first preferred embodiment, the repair island pattern 1 is formed to overlap with the pixel electrode 4 or the drain electrode 6 in the plan view. This allows for a stable repair of the bright spot defect for changing into the black spot without decreasing an aperture ratio of the array substrate.

Second Preferred Embodiment

Figure 4:
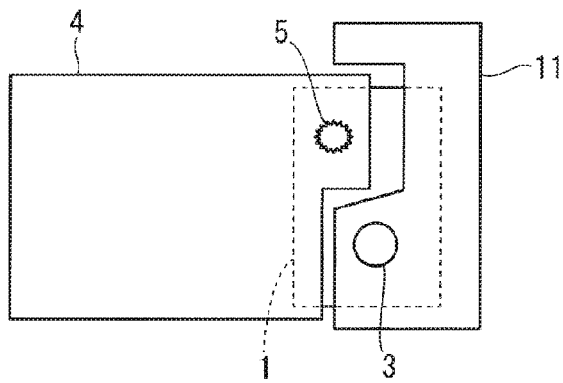
FIG. 4 is a plan view illustrating one example of a configuration of an array substrate in a display apparatus according to a second preferred embodiment of the present invention.

FIG. 4 is a plan view illustrating one example of a configuration of an array substrate in a display apparatus according to a second preferred embodiment of the present invention.

A feature of the second preferred embodiment lies in that a repair island pattern 1 and a common wire 11, instead of the common electrode 2 in the first preferred embodiment (FIG. 1), are formed so that parts of them overlap with each other in a plan view. The other configurations are similar to those of the first preferred embodiment (FIG. 1), and thus the description is omitted.

The repair island 1 and the common wire 11 are formed in different layers from each other and connected to each other via a contact hole 3. Accordingly, a potential (a common potential) of the common wire 11 is supplied to the repair island pattern 1. Note that the repair island pattern 1 and the common wire 11 may be connected to each other with, for example, a laser as necessary, without the contact hole 3 being formed.

One method of repairing a defective pixel being a bright spot defect to be a black spot includes connecting the repair island pattern 1 to a pixel electrode 4 or a drain electrode 6 in a repair connection part 5 by laser irradiation, as in the first preferred embodiment.

As discussed above, according to the second preferred embodiment, the repair island pattern 1 and the common wire 11 is formed to overlap with each other in the plan view. Such a formation reduces redundant light shielding areas, thus enhancing transmittance. This greatly reduces power consumption of the display apparatus.

Note that the above description is applied to, but not limited to, FIG. 1 of the first preferred embodiment. For example, applying the above description to FIGS. 2 and 3 of the first preferred embodiment achieves a similar advantageous effect.

Third Preferred Embodiment

Figure 5:
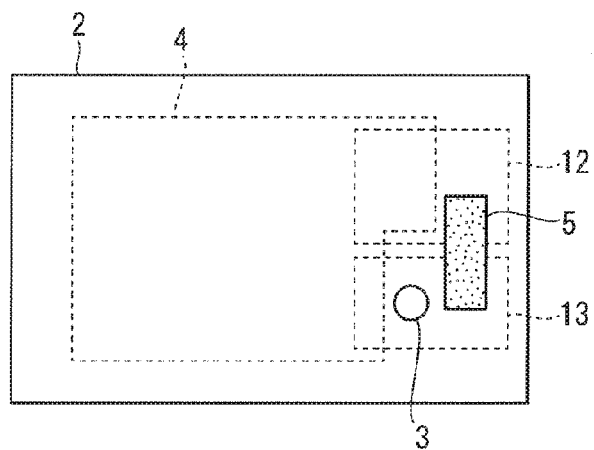
FIG. 5 is a plan view illustrating one example of a configuration of an array substrate in a display apparatus according to a third preferred embodiment of the present invention.

FIG. 5 is a plan view illustrating one example of a configuration of an array substrate in a display apparatus according to a third preferred embodiment of the present invention.

Although the first and second preferred embodiments address one repair island pattern 1, multiple repair island patterns may be formed for a further enhanced aperture ratio of an array substrate or for reduced factors behind failures including static electricity during manufacturing processes. As illustrated in FIG. 5, a feature of the third preferred embodiment lies in that the repair island pattern 1 in the first preferred embodiment (FIG. 1) is divided into a first repair island pattern 12 and a second repair island pattern 13 (a first metal pattern and a second metal pattern). The other configurations are similar to those of the first preferred embodiment (FIG. 1), and thus the description is omitted.

The first repair island pattern 12 is formed to come e into contact with a pixel electrode 4. Moreover, the second repair island pattern 13 is connected to a common electrode 2 via a contact hole 3, and has a potential (a common potential) of the common electrode 2 supplied thereto.

One method of repairing a defective pixel being a bright spot defect to be a black spot includes connecting the first repair island pattern 12 and the second repair island pattern 13 in a repair connection part 5. Such a connecting method has, for instance, a connection by a laser chemical vapor deposition (CVD) method or an inkjet method.

Note that in the above method, the common electrode 2 and a pixel electrode 4, both of which are the transparent electrodes, may be connected to each other using the laser CVD method or the inkjet method without via the first repair island pattern 12 and the second repair island pattern 13.

To prevent unintentional faulty short-circuits during the manufacturing processes, the first repair island pattern 12 and the second repair island pattern 13 are desirably spaced 1 μm or more apart from each other.

As discussed above, according to the third preferred embodiment, the repair island pattern is divided into the multiple repair island patterns. This enables the further enhanced aperture ratio of the array substrate or the reduced factors behind the failures including the static electricity during the manufacturing processes.

Note that the above description is applied to, but not limited to, FIG. 1 of the first preferred embodiment. For instance, applying the above description to FIGS. 2 and 3 of the first preferred embodiment or to the second preferred embodiment achieves a similar advantageous effect.

Fourth Preferred Embodiment

Figure 6:
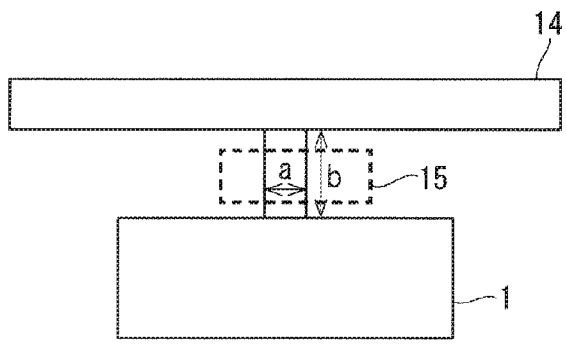
FIG. 6 is a plan view illustrating one example of a configuration of an array substrate in a display apparatus according to a fourth preferred embodiment of the present invention.

FIG. 6 is a plan view illustrating one example of a configuration of an array substrate in a display apparatus according to a fourth preferred embodiment of the present invention.

The first to third preferred embodiments address the repair island pattern 1 (or the first repair island pattern 12 and the second repair island pattern 13) without being connected to any signal wires. A feature of the fourth preferred embodiment lies in that a repair island pattern 1 is formed while being connected to a gate wire 14 connected to a gate electrode of a semiconductor switching element. The repair island pattern 1 and the gate wire 14 are formed in the same layer. The other configurations are similar to those of the first preferred embodiment (FIGS. 1 to 3) or of the second preferred embodiment (FIG. 4), and thus the description is omitted.

In repairing a defective pixel being a bright spot defect to be a black spot, the repair island pattern 1 and the gate wire 14 are cut in a cutting position 15 by laser irradiation. This provides the repair island pattern 1 as illustrated in FIGS. 1, 2, and 4. Then, the repair island pattern 1 is connected to a pixel electrode 4 or a drain electrode 6 in a repair connection part 5 by the laser irradiation, as in the first and second preferred embodiments.

Note that the cutting position 15 desirably has a width a of 10 μm or less, and a length b of 2 μm or more and 20 μm or less.

As discussed above, according to the fourth preferred embodiment, the repair island pattern 1 and the gate wire 14 are connected to each other before repairing. This enables a stable potential and reduces an influence of static electricity or any other factors that can occur during manufacturing processes.

Note that the above description is applied to, but not limited to, the first and second preferred embodiments. For instance, applying the above description to FIG. 5 of the third preferred embodiment achieves a similar advantageous effect.

Fifth Preferred Embodiment

FIGS. 7 and 8 each illustrates one example of the shape of a repair island pattern 1 according to a fifth preferred embodiment of the present invention. The other configurations are similar to those of the first preferred embodiment (FIGS. 1 to 3) or of the second preferred embodiment (FIG. 4), and thus the description is omitted.

The first and second preferred embodiments address the laser irradiation of the repair connection part 5 from where the repair island pattern 1 is formed (the fronts of the sheets of FIGS. 1, 2, and 4) in repairing. A cell that has been provided with a color filter can also be irradiated with a laser from the back surface (FIG. 3) of a substrate 7 for repair.

In the laser irradiation from the back surface of the substrate 7, the repair island pattern 1 prevents seeing the position of a pixel electrode 4 or of a drain electrode 6, both of which are formed above the repair island pattern 1 (FIG. 3). To solve such a problem, one method includes forming a hole part 16 (FIG. 7) or a notch part 17 (FIG. 8) in a position (i.e., a repair connection part 5) to be irradiated with the laser in repairing in the repair island pattern 1. This enables easy identification of the position to be irradiated with the laser.

Note that not only the hole part 16 or the notch part 17 is used as a mark, but also any other marks, such as protrusions, that can identify the position to be irradiated with the laser are used.

It is desirable not to form a common electrode 2 and the pixel electrode 4 in an area (the repair connection part 5) to be irradiated with the laser in order to prevent redundant spreading objects resulted from the laser irradiation.

As discussed above, according to a fifth preferred embodiment, the mark, such as the hole part 16 or the notch part 17 is formed in the repair island pattern 1. This enables the easy identification of the position to be irradiated with the laser, thus enhancing the stability and operation efficiency in repairing.

Note that the above description is applied to, but not limited to, the first and second preferred embodiments. For instance, applying the above description to FIG. 5 of the third preferred embodiment achieves a similar advantageous effect.

It is to be noted that in the present invention, respective preferred embodiments can be freely combined, or can be modified and omitted as appropriate, within the scope of the invention.

While the invention has been shown and described in detail, the foregoing description is in all aspects illustrative and not restrictive. It is therefore understood that numerous modifications and variations can he devised without departing from the scope of the invention.

What is claimed is:

1. A display apparatus comprising:
   an array substrate having a plurality of semiconductor switching elements disposed thereon;
   a metal pattern formed on said array substrate;
   a pixel electrode formed to overlap with said metal pattern in a plan view and not to come into contact with said metal pattern; and
   a common electrode overlapping with said metal pattern in a plan view and including a connection part for connecting said common electrode to said metal pattern.

2. The display apparatus according to claim 1, further comprising a contact hole formed in a location where said metal pattern and said common electrode overlap with each other in a plan view,
   wherein said metal pattern and said common electrode are connected via said contact hole being said connection part.

3. The display apparatus according to claim 1, wherein said metal pattern and said common electrode are connected via said connection part formed by irradiating with a laser.

4. The display apparatus according to claim 1, wherein said metal pattern and said pixel electrode can be connected by irradiating with a laser.

5. The display apparatus according to claim 4, wherein said metal pattern includes a hole part or a notch part in a location to he irradiated with said laser.

6. The display apparatus according to claim 1, wherein each of said plurality of semiconductor elements has a drain electrode formed to overlap with said pixel electrode in a plan view and to come into contact with said pixel electrode, and
   said metal pattern and said drain electrode can be connected by irradiating with a laser.

7. The display apparatus according to claim 6, wherein an area to be irradiated with said laser is absent from said pixel electrode and said common electrode.

8. The display apparatus according to claim 6, wherein said metal pattern includes a hole part or a notch part in a location to be irradiated with said laser.

9. The display apparatus according to claim 1, further comprising a common wire overlapping with said metal pattern in a plan view and elongating from said common electrode,
   wherein said common wire is formed to come into contact with said metal pattern instead of with said common electrode.

10. The display apparatus according to claim 1, wherein said metal pattern includes a first metal pattern and a second metal pattern spaced apart from each other.

11. The display apparatus according to claim 10, wherein said first metal pattern and said second metal pattern can be connected by a laser CVD method or an ink jet method.

12. The display apparatus according to claim 1, wherein said metal pattern is formed to be connected to a gate wire connected to a gate electrode of each of said plurality of semiconductor switching elements.

13. The display apparatus according to claim 12, wherein said metal pattern and said gate wire can be cut by irradiating with a laser.

\* \* \* \* \*

UNITED STATES PATENT AND TRADEMARK OFFICE
CERTIFICATE OF CORRECTION

PATENT NO. : 9,508,753 B2
APPLICATION NO. : 14/992339
DATED : November 29, 2016
INVENTOR(S) : Katsuaki Murakami It is certified that error appears in the above-identified patent and that said Letters Patent is hereby corrected as shown below:

In the Claims

In Claim 5, in Column 8, Line 16:
"location to he irradiated with said laser."
Should be changed to:
--location to be irradiated with said laser.--.

Signed and Sealed this
Twenty-sixth Day of March, 2024

Katherine Kelly Vidal
*Director of the United States Patent and Trademark Office*